United States Patent
Kim et al.

(10) Patent No.: US 10,418,573 B2
(45) Date of Patent: Sep. 17, 2019

(54) ORGANIC LIGHT-EMITTING DEVICE COMPRISING HOST, PHOSPHORESCENT DOPANT AND FLUORESCENT DOPANT

(71) Applicant: SEOUL NATIONAL UNIVERSITY R&DB FOUNDATION, Gwanak-gu, Seoul (KR)

(72) Inventors: Jang-Joo Kim, Seoul (KR); Hyun-Gu Kim, Seoul (KR); Kwon-Hyeon Kim, Changwon-si (KR); Jin-Won Sun, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 15/112,630

(22) PCT Filed: Jul. 27, 2015

(86) PCT No.: PCT/KR2015/007768
§ 371 (c)(1),
(2) Date: Jul. 19, 2016

(87) PCT Pub. No.: WO2016/133252
PCT Pub. Date: Aug. 25, 2016

(65) Prior Publication Data
US 2017/0346029 A1 Nov. 30, 2017

(30) Foreign Application Priority Data
Feb. 17, 2015 (KR) ........................ 10-2015-0024243

(51) Int. Cl.
*H01L 51/00* (2006.01)
*H01L 51/50* (2006.01)
(Continued)

(52) U.S. Cl.
CPC ...... *H01L 51/5004* (2013.01); *H01L 51/0035* (2013.01); *H01L 51/5016* (2013.01);
(Continued)

(58) Field of Classification Search
None
See application file for complete search history.

(56) References Cited

U.S. PATENT DOCUMENTS 7,572,522 B2 * 8/2009 Seo ........................ H01L 51/002
257/101
7,943,925 B2 * 5/2011 Yamazaki ........... H01L 51/5036
257/103
(Continued)

FOREIGN PATENT DOCUMENTS

CN 103985822 A 8/2014
EP 2511360 A1 10/2012
(Continued)

OTHER PUBLICATIONS

"English Language Abstract of EP2511360."
(Continued)

*Primary Examiner* — Telly D Green
(74) *Attorney, Agent, or Firm* — Ware, Fressola, Maguire & Barber LLP

(57) ABSTRACT

According to an aspect, an organic light-emitting device includes: a first electrode; a second electrode facing the first electrode; and an emission layer disposed between the first electrode and the second electrode and including a host and a dopant, wherein the host is an exciplex host, which is a combination of a hole transporting host and an electron transporting host which form an exciplex, or a delayed fluorescent organic compound, and the dopant includes both a phosphorescent dopant and a fluorescent dopant.

16 Claims, 8 Drawing Sheets

(51) Int. Cl.
*C09K 11/06* (2006.01)
*C09K 11/87* (2006.01)

(52) U.S. Cl.
CPC ...... *H01L 51/5024* (2013.01); *H01L 51/5056* (2013.01); *H01L 51/5072* (2013.01); *C09K 11/06* (2013.01); *C09K 11/87* (2013.01); *C09K 2211/185* (2013.01); *H01L 51/0067* (2013.01); *H01L 51/0085* (2013.01); *H01L 2251/5376* (2013.01); *H01L 2251/5384* (2013.01)

(56) References Cited

U.S. PATENT DOCUMENTS

| | | | |
|---|---|---|---|
| 8,643,268 B2* | 2/2014 | Ogiwara | H01L 51/5012 313/504 |
| 8,729,310 B2* | 5/2014 | Osaka | C07D 209/86 564/431 |
| 8,766,249 B2* | 7/2014 | Sawada | C07D 519/00 257/40 |
| 8,993,129 B2 | 3/2015 | Endo et al. | |
| 9,276,228 B2* | 3/2016 | Seo | H01L 51/5016 |
| 9,559,313 B2* | 1/2017 | Seo | H01L 51/5016 |
| 2005/0048310 A1* | 3/2005 | Cocchi | H01L 51/0061 428/690 |
| 2006/0134464 A1* | 6/2006 | Nariyuki | C09K 11/06 428/690 |
| 2006/0228577 A1* | 10/2006 | Nagara | C09K 11/06 428/690 |
| 2007/0244320 A1* | 10/2007 | Inoue | C07F 15/0033 544/225 |
| 2008/0160345 A1* | 7/2008 | Inoue | C07F 15/0033 428/691 |
| 2008/0286604 A1* | 11/2008 | Inoue | C07F 15/0033 428/690 |
| 2009/0166563 A1* | 7/2009 | Yokoyama | H01L 51/0013 250/492.1 |
| 2010/0052527 A1* | 3/2010 | Ikeda | H01L 51/5016 313/504 |
| 2010/0145044 A1* | 6/2010 | Inoue | C07F 15/0033 544/225 |
| 2010/0301318 A1* | 12/2010 | Kuma | B82Y 10/00 257/40 |
| 2011/0001146 A1* | 1/2011 | Yamazaki | H05B 33/04 257/79 |
| 2011/0210316 A1* | 9/2011 | Kadoma | C07D 403/10 257/40 |
| 2011/0215714 A1* | 9/2011 | Seo | C09K 11/06 313/504 |
| 2011/0233604 A1* | 9/2011 | Ikeda | H01L 51/5016 257/103 |
| 2012/0098417 A1* | 4/2012 | Inoue | C07F 15/0033 313/504 |
| 2012/0205632 A1* | 8/2012 | Shitagaki | H01L 51/0059 257/40 |
| 2012/0205687 A1* | 8/2012 | Yamazaki | H01L 51/5016 257/89 |
| 2012/0206035 A1* | 8/2012 | Shitagaki | H01L 51/0072 313/503 |
| 2012/0217486 A1* | 8/2012 | Takemura | B82Y 20/00 257/40 |
| 2012/0217487 A1* | 8/2012 | Yamazaki | H01L 51/0059 257/40 |
| 2012/0217869 A1 | 8/2012 | Adachi et al. | |
| 2012/0241732 A1 | 9/2012 | Endo et al. | |
| 2012/0242219 A1* | 9/2012 | Seo | C07D 409/10 313/504 |
| 2012/0248421 A1* | 10/2012 | Yamazaki | H01L 51/5016 257/40 |
| 2012/0248968 A1* | 10/2012 | Ogiwara | H01L 51/5012 313/504 |
| 2012/0256535 A1* | 10/2012 | Seo | C09K 11/06 313/504 |
| 2013/0048964 A1* | 2/2013 | Takeda | H01L 51/0058 257/40 |
| 2013/0056720 A1* | 3/2013 | Kim | C07D 401/14 257/40 |
| 2013/0207088 A1* | 8/2013 | Seo | H01L 51/5016 257/40 |
| 2013/0270531 A1* | 10/2013 | Seo | H01L 51/5016 257/40 |
| 2013/0277653 A1* | 10/2013 | Osaka | H01L 51/0052 257/40 |
| 2013/0277654 A1 | 10/2013 | Seo et al. | |
| 2013/0277655 A1* | 10/2013 | Seo | H01L 51/5016 257/40 |
| 2013/0277656 A1* | 10/2013 | Seo | H01L 51/5016 257/40 |
| 2013/0292656 A1* | 11/2013 | Seo | H05B 33/14 257/40 |
| 2013/0306945 A1* | 11/2013 | Seo | H01L 51/5016 257/40 |
| 2014/0014930 A1* | 1/2014 | Hirose | H01L 51/0072 257/40 |
| 2014/0034925 A1* | 2/2014 | Osaka | H01L 51/0067 257/40 |
| 2014/0034926 A1* | 2/2014 | Matsubara | H01L 51/504 257/40 |
| 2014/0034927 A1* | 2/2014 | Seo | H01L 51/504 257/40 |
| 2014/0034930 A1* | 2/2014 | Seo | H01L 51/5016 257/40 |
| 2014/0034931 A1* | 2/2014 | Inoue | H01L 51/0067 257/40 |
| 2014/0034932 A1* | 2/2014 | Seo | H01L 51/5028 257/40 |
| 2014/0042469 A1 | 2/2014 | Seo et al. | |
| 2014/0061604 A1* | 3/2014 | Seo | C09K 11/06 257/40 |
| 2014/0103329 A1* | 4/2014 | Ogiwara | H01L 51/5012 257/40 |
| 2014/0175391 A1* | 6/2014 | Song | H01L 51/5008 257/40 |
| 2014/0319492 A1 | 10/2014 | Seo et al. | |
| 2015/0053958 A1 | 2/2015 | Ishisone et al. | |
| 2015/0060824 A1 | 3/2015 | Ishiguro et al. | |
| 2015/0069352 A1* | 3/2015 | Kim | H01L 51/5004 257/40 |
| 2015/0166886 A1 | 6/2015 | Endo et al. | |
| 2016/0164020 A1* | 6/2016 | Kim | H01L 51/5028 257/40 |
| 2016/0197282 A1 | 7/2016 | Tanimoto et al. | |

FOREIGN PATENT DOCUMENTS

| | | | | |
|---|---|---|---|---|
| KR | 1020090090656 | | 8/2009 | |
| KR | 20120112517 A | * | 10/2012 | ............ C09B 57/00 |
| KR | 1020120112517 | | 10/2012 | |
| KR | 20130115027 A | * | 10/2013 | ......... H01L 51/5004 |
| KR | 1020130115027 | | 10/2013 | |
| KR | 1020140092710 | | 7/2014 | |
| WO | 2011070963 A1 | | 6/2011 | |
| WO | 2013157506 A1 | | 10/2013 | |
| WO | 2014112821 | | 7/2014 | |

OTHER PUBLICATIONS

KR1020090090656 English Language Abstract (1 page).
English Language Abstract of EP2511360, corresponding to WO 2011070963.
Hiroki Uoyama, et al., "Highly efficient organic light-emitting diodes from delayed fluorescence", Nature, vol. 492, Dec. 13, 2012, 7 pages.
Sun, et al., "A Fluorescent Organic Light-Emitting Diode with 30% External Quantum Efficiency," Advanced Materials (2014) (5 pages).
Bo Seong Kim et al., "Engineering of Mixed Host for High External Quantum Efficiency above 25% in Green Thermally Activated Delayed Fluorescence Device," 24 Advanced Functional Materials 3970-3977 (Apr. 28, 2014).

(56) References Cited

OTHER PUBLICATIONS

Zhou et al., "Host to Guest Energy Transfer Mechanism in Phosphorescent and Fluorescent Organic Light-Emitting Devices Utilizing Exciplex-Forming Hosts," 118 J. Phys. Chem. C. 24006-24012 (Sep. 24, 2014).

Kim et al., "Phosphine Oxide Type Bipolar Host Material for High Quantum Efficiency in Thermally Activated Delayed Fluorescent Device," 6 ACS Applied Materials & Interfaces 8396-8400 (Apr. 28, 2014).

Hung et al., "The First Tandem, All-exciplex-based WOLED," Scientific Reports, Jun. 4, 2014 (6 pages).

Adachi, "Third-Generation Organic Electrolumiescence Materials," 53 Japanese J. of Applied Physics, May 22, 2014 (12 pages).

Tao et al., "Thermally Activated Delayed Fluorescence Materials Towards the Breakthrough of Organoelectronics," 26 Advanced Materials 7931-7958 (2014).

Cho et al., "A Universal Host Material for High External Quantum Efficiency Close to 25% and Long Lifetime in Green Fluourescent and Phosphorescent OLEDs," 26 Advanced Materials 4050-4055 (2014).

Seo et al., "Exciplex-triplet energy transfer: A new method to achieve extremely efficient organic light-emitting diode with external quantum efficiency over 30% and drive voltage below 3V," 53 Japanese J. of Applied Physics, Mar. 17, 2014 (9 pages).

Park et al., "Exciplex-Forming Co-Host for Organic Light-Emitting Diodes with Ultimate Efficiency," 23 Advanced Functional Materials 4914-4920 (2013).

\* cited by examiner

ORGANIC LIGHT-EMITTING DEVICE COMPRISING HOST, PHOSPHORESCENT DOPANT AND FLUORESCENT DOPANT

TECHNICAL FIELD

The present invention relates to an organic light-emitting device, and more particularly, to an organic light-emitting device including a host, a phosphorescent dopant, and a fluorescent dopant.

BACKGROUND ART

In conventional fluorescent organic light-emitting devices using a host and a fluorescent dopant, only singlet excitons, which are formed at a ratio of 25% of excitons generated under electrical excitation condition, are emitted, thereby failing to obtain a high efficiency. Meanwhile, in phosphorescent organic light-emitting devices using a phosphorescent dopant instead of a fluorescent dopant, all singlet and triplet excitons can be subjected to conversion to generate light, thereby achieving a high efficiency. However, due to high prices of a phosphorescent dopant, it is disadvantageous to use phosphorescent organic light-emitting devices in terms of an economic aspect. In this regard, there are ongoing studies of a delayed fluorescent dopant, which improves a device efficiency by increasing singlet excited states of a fluorescent dopant by converting triplet excited states to singlet excited states by reverse intersystem crossing (RISC). However, such a delayed fluorescent dopant has a wide emission spectrum and a lifetime of devices which include the delayed fluorescent dopant needs to be verified.

DETAILED DESCRIPTION OF THE INVENTION

Technical Problem

The technical problem of the present invention to be solved is to provide a fluorescent organic light-emitting device that is economical and has a high external quantum efficiency and an improved roll-off characteristic.

Technical Solution

According to an aspect, disclosed is an organic light-emitting device including: a first electrode; a second electrode facing the first electrode; and an emission layer disposed between the first electrode and the second electrode and including a delayed fluorescent host and a dopant. The delayed fluorescent host may include an exciplex host, a combination of a hole transporting host and an electron transporting host which form an exciplex. Alternatively, the delayed fluorescent host may include a delayed fluorescent organic compound in the form of D-C-A (an electron donation group: D—a connecting group: C—an electron accepting group: A), in the form of D-C-A-C-D, or in the form of A-C-D-C-A. The dopant may include both a phosphorescent dopant and a fluorescent dopant.

A difference between a singlet energy level and a triplet energy level of the exciplex (i.e., singlet and triplet exciplex energy levels) in the exciplex host may he about 0 eV or more to less than about 0.3 eV.

A singlet exciplex energy level and a triplet exciplex energy level of the exciplex host may be higher than a singlet excited energy level of the fluorescent dopant.

A weight ratio of the hole transporting host to the electron transporting host, which constitute the exciplex host, may be in a range of about 20:80 to about 80:20.

A difference between a singlet excited state energy level and a triplet excited state energy level of the delayed fluorescent organic compound may be about 0 eV or more to less than about 0.3 eV.

A singlet excited state energy level and a triplet excited state energy level of the delayed fluorescent organic compound may be higher than a singlet excited state energy level of the fluorescent dopant.

A triplet excited state energy level of the phosphorescent dopant may be higher than a singlet excited state energy level and a triplet excited state energy level of the fluorescent dopant.

The phosphorescent dopant may stimulate and increase the reverse intersystem crossing (RISC) of the delayed fluorescent host, and thus an exciplex at a triplet state may be converted to an exciplex at a singlet state, or a triplet excited state of the delayed fluorescent organic compound may be converted to a singlet excited state of the delayed fluorescent organic compound.

A singlet excited energy of the exciplex or a singlet excited state energy of the delayed fluorescent organic compound may be transferred to the fluorescent dopant.

A photoluminescence spectrum of the delayed fluorescent host may overlap with an absorption spectrum of the fluorescent dopant.

A photoluminescence spectrum of the phosphorescent dopant may overlap with an absorption spectrum of the fluorescent dopant.

The hole transporting host may include a carbazole derivative or an aromatic amine compound.

The electron transporting host may include a π-electron deficient heteroaromatic ring, a phosphine oxide group-containing compound, a sulfur oxide group-containing compound, or a triazine derivative.

The phosphorescent dopant may include a transition metal complex.

The phosphorescent dopant may include a complex including iridium (Ir), platinum (Pt), osmium (Os), gold (Au), titan (Ti), zirconium (Zr), hafnium (Hf), europium (Eu), terbium (Tb), or thulium (Tm).

The phosphorescent dopant may include an Ir complex including a homoleptic ligand or a heteroleptic ligand.

Examples of the fluorescent dopant may include perylene, 2,5,8,11-tetra-tert-butylperylene (TBPe), 1,4-bis[2-(3-N-ethylcarbazoryl)vinyl]benzene (BCzVB), 4,4'-bis(9-ethyl-3-carbazovinylene)-1,1'-biphenyl (BCzVBi), (4,4'-bis[4-diphenylamino]styryl)biphenyl (BDAVBi), 4-(di-p-tolylamino)-4'-[(di-p-tolylamino)styryl]stilbene (DPAVB), 4,4'-bis[4-(di-p-tolylamino)styryl]bipnehyl (DPAVBi), 1-4-di-[4-(N,N-diphenyl)amino] styryl-benzene (DSA-Ph), Coumarin 6, C545T, N,N'-dimethyl-quinacridone (DMQA), 5,12-dibutylquinacridone (DBQA), 9,10-bis[N,N-di-(p-tolyl)-amino]anthracene (TTPA), 9,10-bis[phenyl(m-tolyl)-amino]anthracene (TPA), $N^{10},N^{10},N^{10'},N^{10'}$-tetra-tolyl-9,9'-bianthracene-10,10'-diamine (BA-TTB), $N^{10},N^{10},N^{10'},N^{10'}$-tetraphenyl-9,9'-bianthracene-10,10'-diamine (BA-TAB), $N^{10},N^{10'}$-diphenyl-$N^{10},N^{10'}$-dinaphthalenyl-9,9'-bianthracene-10,10'-diamine (BA-NPB), N,N'-diethylquinacridone (DEQ), 4-(dicyanomethylene)-2-methyl-6-[p-(dimethylamino)styryl]-4H-pyran (DCM), 4-(dicyanomethylene)-2-methyl-6-julolidyl-9-enyl-4H-pyran (DCM2), 4-(dicyanomethylene)-2-methyl-6-(1,1,7,7-tetramethyljulolidyl-9-enyl)-4H-pyran (DCJT), 4-(dicyanomethylene)-2-tert-butyl-6-(1, 1,7,7,-tetramethyljulolidyl-9-enyl)-4H-pyran (DCJTB), DCJTI, DCJMTB, 6,13-diphenylpentacene (DPP), 3-(dicyanomethylene)-5,5-dimethyl-1-[(4-dimethylamino)styryl]cyclohexene (DCDDC), 6-methyl-3-[3-(1, 1, 6, 6-tetramethyl-10-oxo-2, 3, 5, 6-tetrahydro-1H, 4H, 10H-11-oxa-3a-azabenzo[de]-anthracen-9-yl)acryloyl]pyran-2,4-dione (AAAP), 3-(N-phenyl-N-p-tolylamino)-9-(N-p-styrylphenyl-N-p-tolylamino)perylene ((PPA)(PSA)Pe-1), 1,10-dicyano-substituted bis-styrylnaphthalene derivative (BSN), tetraphenyldibenzoperiflanthene (DBP), 2,8-di-tert-butyl-5,11-bis(4-tert-butylphenyl)-6,12-diphenyltetracene (TBRb), or rubrene.

A weight ratio of the delayed fluorescent host:phosphorescent dopant:fluorescent dopant may be in a range of about 99.8:0.1:0.1 to about 70:15:15.

The organic light-emitting device may further include a hole transporting region between the emission layer and the first electrode, and an electron transporting region between the emission layer and the second electrode.

Advantageous Effects of the Invention

When a combination of a hole transporting host and an electron transporting host which form an exciplex, or a delayed fluorescent organic compound is used as a host in an emission layer, and such a host is doped with both a phosphorescent dopant and a fluorescent dopant, a fluorescent organic light-emitting device with a high external quantum efficiency and a high efficiency at a high luminance may be provided.

BEST MODE

Figure 1:
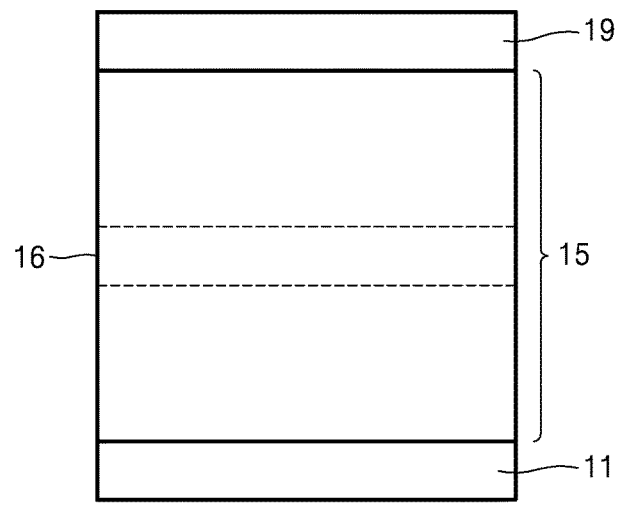
FIG. 1 is a cross-sectional view schematically illustrating an organic light-emitting device according to an embodiment.

Hereinafter, the present invention will be described in detail by explaining exemplary embodiments of the present invention with reference to the attached drawings. The present invention may, however, be embodied in many different forms and should not be construed as being limited to the exemplary embodiments set forth herein. Rather, these embodiments are provided so that this disclosure will he thorough and complete, and will fully convey the scope of the present invention to one of ordinary skill in the art. Like reference numerals in the drawings denote like elements.

The term "delayed fluorescent host" used in the present specification refers to a host in which transition to a singlet excited state from a triplet excited state occurs by reverse intersystem crossing (RISC).

The term "exciplex host" used in the present specification refers to a combination of hosts which form an exciplex in an emission layer.

The term "host exciplex" used in the present specification refers to an exciplex in the exciplex host.

The term "triplet exciplex energy level" used in the present specification refers to a triplet energy level of an exciplex, and has the same meaning as a triplet excited energy level of an exciplex.

The term "singlet exciplex energy level" used in the present specification refers to a singlet energy level of an exciplex, and has the same meaning as a singlet excited energy level of an exciplex.

FIG. 1 is a cross-sectional view schematically illustrating an organic light-emitting device 10 according to an embodiment.

The organic light-emitting device according to an embodiment includes a first electrode 11, a second electrode 19 facing the first electrode 11, and an organic layer 15 disposed between the first electrode 11 and the second electrode 19. The organic layer 15 includes an emission layer 16 including an exciplex host or a delayed fluorescent organic compound, a phosphorescent dopant and a fluorescent dopant, wherein the exciplex host is a combination of hosts which form an exciplex.

The first electrode 11 may be an anode to which a positive (+) voltage is applied, and the second electrode 19 may be a cathode to which a negative (−) voltage is applied. Alternatively, the first electrode 11 may be a cathode, and the second electrode 19 may be an anode. However, for convenience of explanation, embodiments herein are described where the first electrode 11 is an anode and the second electrode 19 is a cathode.

When a voltage is applied to the first electrode 11 and the second electrode 19, in the organic layer 15, holes are transported by a hole transporting material, and electrons are transported by an electron transporting material, thereby generating an excited state (an exciplex or an exciton) in the emission layer 16.

In some embodiments, the organic layer 15 may include a hole transporting region (not shown) between the emission layer 16 and the first electrode 11, and a electron transporting region (not shown) between the emission layer 16 and the second electrode 19. The hole transporting region is a region related to injection and transport of holes from the anode to the emission layer 16, and the electron transporting region is a region related to injection and transport of electrons from the cathode to the emission layer 16.

The emission layer 16 includes a delayed fluorescent host, a phosphorescent dopant, and a fluorescent dopant together. The delayed fluorescent host may include an exciplex host, which is a combination of hosts that form an exciplex, or a single delayed fluorescent organic compound.

A difference between a singlet exciplex energy level and a triplet exciplex energy level, i.e., a difference between a singlet energy level and a triplet energy level of exciplex, in the exciplex host, or a difference between a singlet excited state energy level and a triplet excited state energy level of the delayed fluorescent organic compound, may be about 0 eV or more, but less than about 0.3 eV. Since the difference between the triplet exciplex energy level and the singlet exciplex energy level of the host exciplex is small, the triplet exciplex may be easily converted to the singlet exciplex by reverse intersystem crossing (RISC). Alternatively, since the difference between the triplet energy level and the singlet energy level of the delayed fluorescent organic compound is small, the triplet excited states of the delayed fluorescent organic compound may be easily converted to the singlet excited states of the delayed fluorescent organic compound by RISC. That is, a small difference between the triplet energy level and the singlet energy level of the delayed fluorescent host may facilitate RISC to the singlet state from the triplet state.

The singlet and triplet exciplex energy levels of the host exciplex, or the singlet and triplet excited state energy levels of the delayed fluorescent organic compound may be higher than the singlet excited state energy level of the fluorescent dopant.

The triplet excited state energy level of the phosphorescent dopant may be higher than the singlet and triplet excited stated energy levels of the fluorescent dopant.

The presence of the phosphorescent dopant may further facilitate and increase the RISC of the host exciplex, thereby further converting the triplet exciplex to the singlet exciplex, compared to the case where the phosphorescent dopant is not present. In addition, the presence of the phosphorescent dopant may further facilitate and increase the RISC of the delayed fluorescent organic compound, thereby further converting the triplet excited state of the delayed fluorescent organic compound to the singlet excited state of the delayed fluorescent organic compound, compared to the case where the phosphorescent dopant is not present.

The singlet excited energy of the exciplex or the singlet excited state energy of the delayed fluorescent organic compound produced upon the increased RISC may be transferred to the fluorescent dopant. According to the energy transfer, the singlet excited states of the fluorescent dopant may be more produced, thereby increasing a fluorescence efficiency.

Here, a photoluminescence spectrum of the delayed fluorescent host may overlap with an absorption spectrum of the fluorescent dopant, and an extent of the overlap may be large. The meaning of the overlap at a large extent refers to, for example, a case where ⅓ or more of the full width at half maximum (FWHM) of a peak is overlapped when a spectrum peak is normalized. In addition, a photoluminescence spectrum of the phosphorescent dopant may overlap with an absorption spectrum of the fluorescent dopant, and an extent of the overlap may be large. In some embodiments, a photoluminescence spectrum of the delayed fluorescent host may overlap with a photoluminescence spectrum of the phosphorescent dopant, and an extent of the overlap may be large.

In the emission layer 16, the exciplex host may include a combination of a hole transporting host and an electron transporting host which form an exciplex. Here, a lower unoccupied molecular orbital (LUMO) of the hole transporting host may be higher than that of the electron transporting host by about 0.2 eV or more, but not as high as a band gap of the hole transporting host. In addition, a highest occupied molecular orbital (HOMO) of the hole transporting host may be higher than that of the electron transporting host by about 0.2 eV or more, but not as high as a band gap of the hole transporting host. When the LUMO and the HOMO of the hole transporting host and the electron transporting host are within these ranges, the hole transporting host and the electron transporting host are more likely to form an exciplex.

When the singlet excited state of the fluorescent dopant relaxes to a ground state, fluorescence is generated. In an embodiment, the singlet excited states of the fluorescent dopant are increased by using the delayed fluorescent host, the phosphorescent dopant, and the fluorescent dopant, thereby increasing an efficiency of the fluorescence.

In the emission layer 16, the hole transporting host which forms an exciplex may include, for example, a carbazole derivative or an aromatic amine compound. Examples of the hole transporting host may include tris(4-carbazoyl-9-ylphenyl)amine (TCTA), 1,3-bis(9-carbazolyl)benzene (mCP), 4,4'-bis(N-carbazolyl)-1,1'-biphenyl (CBP), 3,3-bis(carbazol-9-yl)biphenyl (mCBP), N,N'-di(1-naphthyl)-N,N'-diphenyl-(1,1'-biphenyl)-4,4'-diamine (NPB), 4,4',4''-tris[phenyl(m-tolyl)amino]triphenylamine (m-MTDATA), and N,N'-bis(3-methylphenyl)-N,N'-diphenylbenzidine (TPD), but embodiments are not limited thereto.

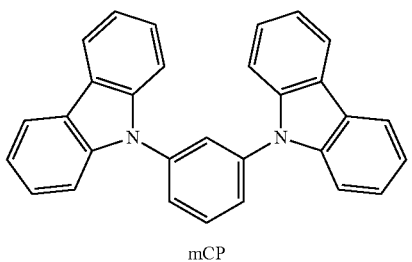

mCP

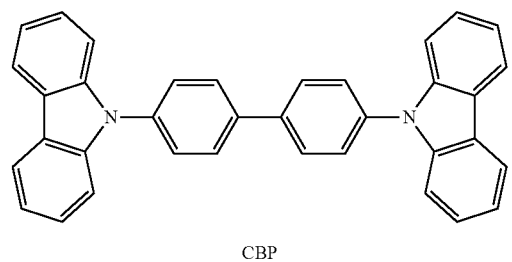

CBP

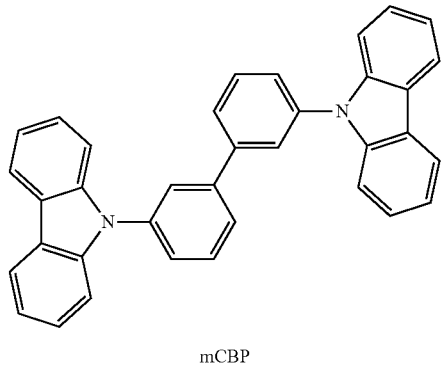

mCBP

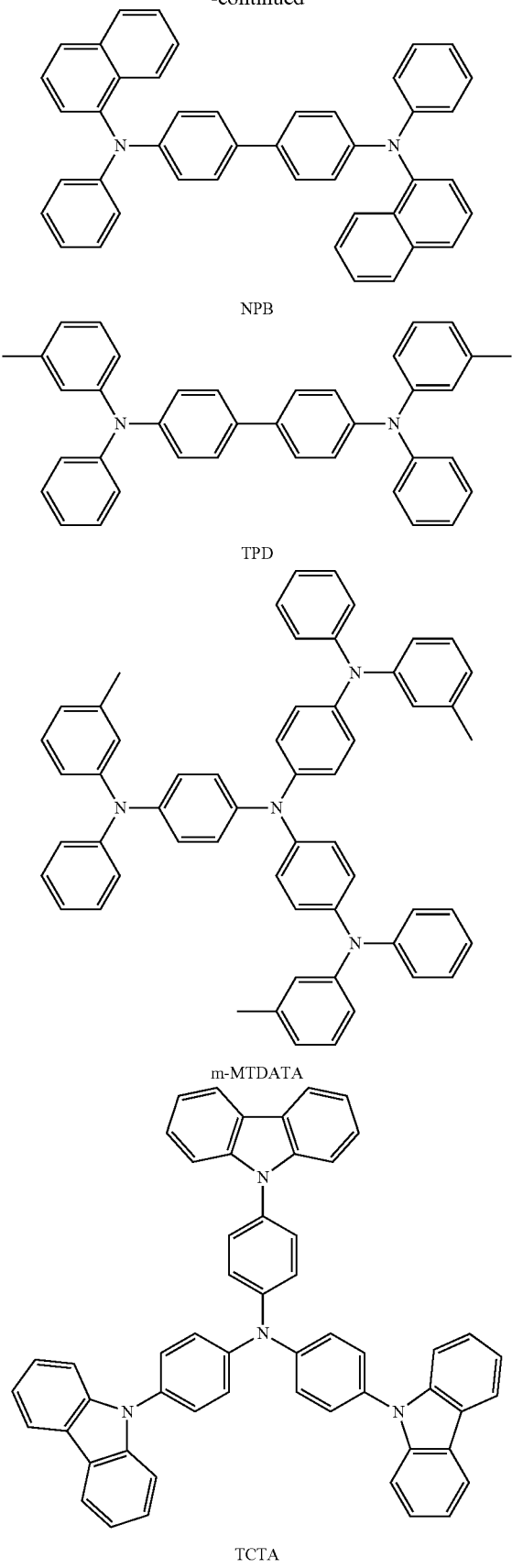

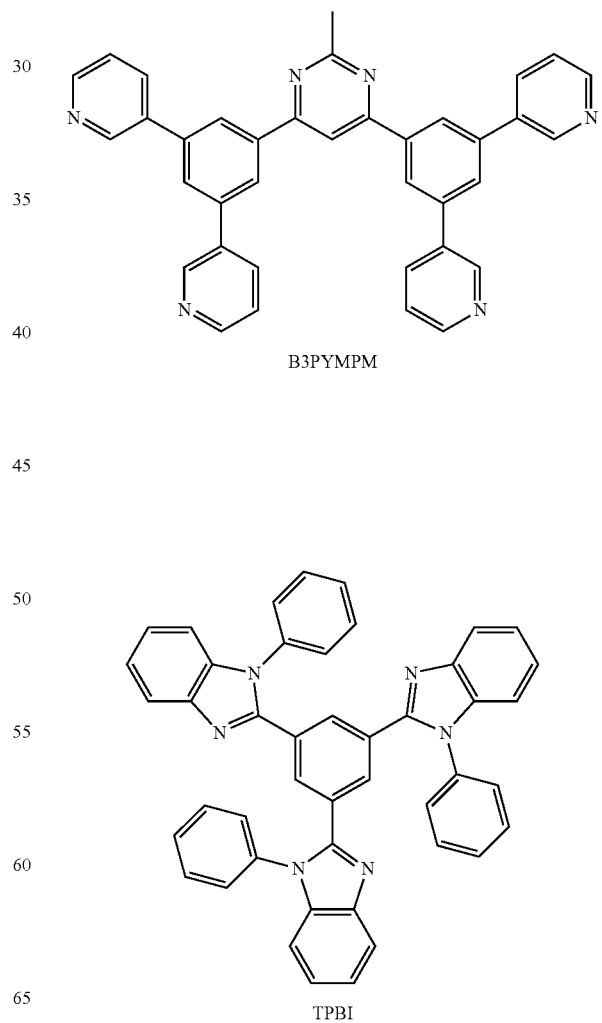

In the emission layer 16, the electron transporting host which forms an exciplex may include, for example, a π-electron deficient heteroaryl compound, a phosphine oxide group-containing compound, a sulfur oxide group-containing compound, or a triazine derivative. Examples of the electron transporting host may include bis-4,6-(3,5-di-2-pyridylphenyl)-2-methylpyrimi-dine (B2PYMPM), bis-4,6-(3,5-di-3-pyridylphenyl)-2-methylpyrimi-dine (B3PYMPM), bis-4,6-(3,5-di-4-pyridylphenyl)-2-methyl-pyrimi-dine (B4PYMPM), 2,2',2"-(1,3,5-benzenetriyl)tris-[1-phenyl-1H-benzimidazole] (TPBi), tris(2,4,6-trimethyl-3-(pyridin-3-yl)phenyl)borane (3TPYMB), 1,3-bis[3,5-di(pyridin-3-yl) phenyl]benzene (BmPyPB), 1,3-bis[3,5-di(pyridin-3-yl)phenyl]benzene (BmPyPhB), 3,3',5,5'-tetra[(M-pyridyl)-phen-3-yl]biphenyl (BP4mPy), 3,3'[5'[3-(3-pyridinyl)phenyl][1,1':3',1"-terphenyl]-3,3'-diyl]bispyridine (TmPyPB), BSFM (see the corresponding formula below), PO-T2T (see the corresponding formula below), and dibenzo[b,d]thiophene-2,8-diylbis(diphenylphosphine oxide) (PO15), but embodiments are not limited thereto.

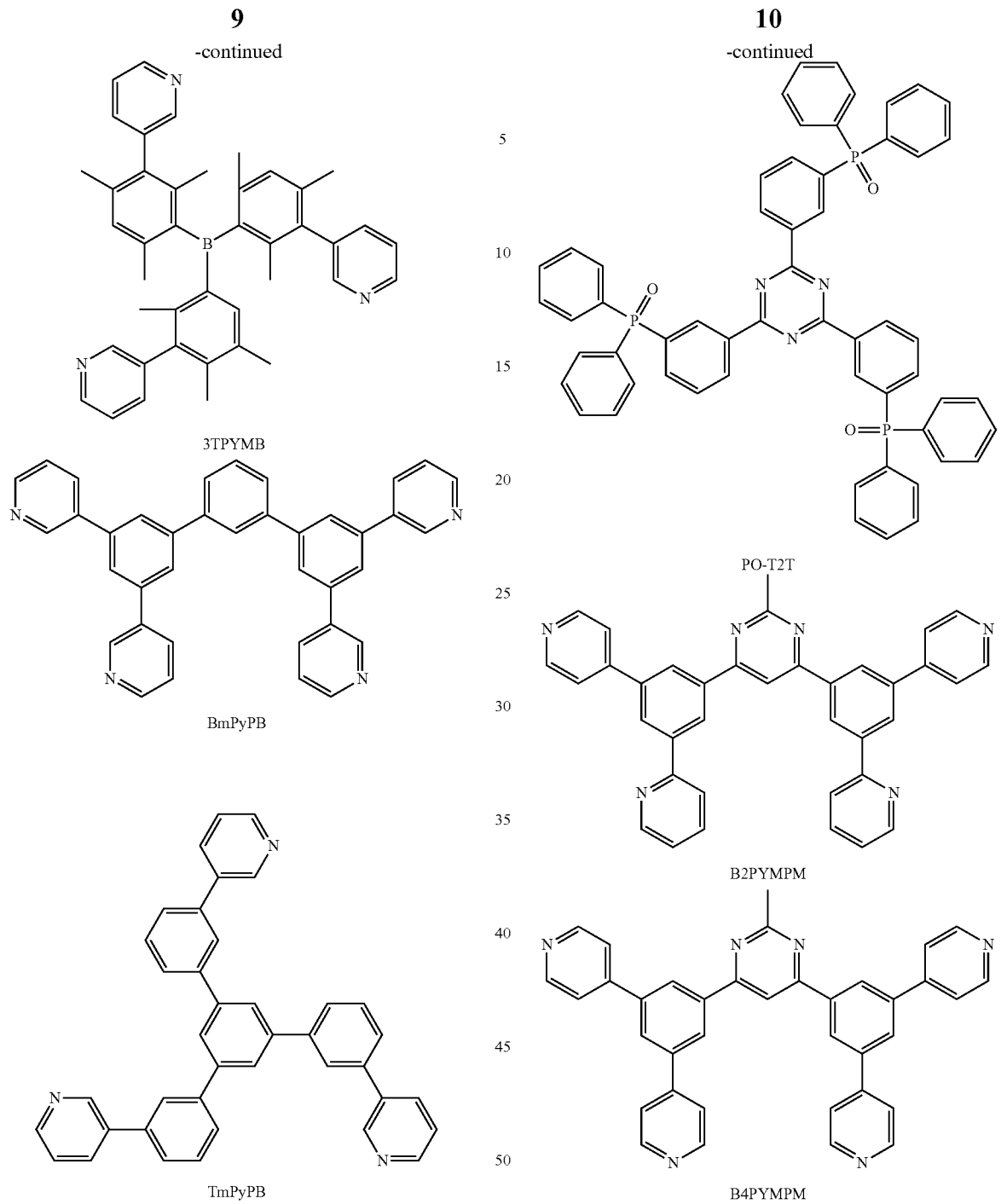

3TPYMB

BmPyPB

TmPyPB

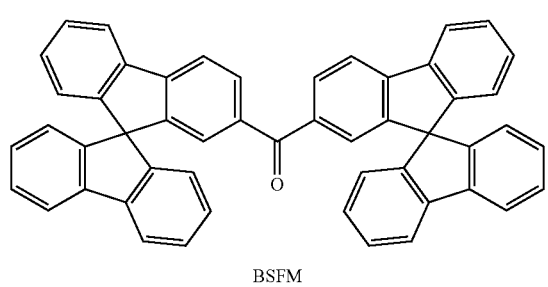

BSFM

PO-T2T

B2PYMPM

B4PYMPM

A weight ratio of the hole transporting host to the electron transporting host that together form an exciplex host may be in a range of about 20:80 to about 80:20. When the weight ratio of the hole transporting host to the electron transporting host is within this range, the exciplex host may be efficiently produced.

Examples of the combination of the hole transporting host and the electron transporting host which form an exciplex may include TCTA:B4PYMPM, TCTA:B3PYMPM, TCTA:TPBi, TCTA:3TPYMB, TCTA:BmPyPB, TCTA:BSFM, CBP:B3PYMPM, mCP:B3PYMPM, or NPB:BSFM, but embodiments are not limited thereto.

In the emission layer 16, the delayed fluorescent organic compound may include a fluorescent organic material in the form of D-A-C (an electron donating group: D—a connecting group: C—an electron accepting group: A), in the form of D-C-A-C-D, or in the form of A-C-D-C-A, but embodiments are not limited thereto. For example, the form of D-C-A is a structure including an electron donating group D linked to an electron accepting group A via a connecting group C. The form of D-C-A-C-D includes one electron donating group D linked to an electron accepting group A via one connecting group C and another electron donating group D linked to the electron accepting group A via another connecting group C. The form of A-C-D-C-A includes one electron accepting group A linked to an electron donating group D via one connecting group C and another electron accepting group A linked to the electron donating group D via another connecting group C.

The electron donating group D may include, for example, a carbazole-based group or an aromatic amine-based group.

The electron accepting group A may include, for example, a pyridine-based group, a pyrrole-based group, a triazine-based group, a phosphoine oxide-based group, or a sulfur oxide-based group.

The connecting group C may include, for example, a phenylene group or a naphthylene group.

Examples of the delayed fluorescent organic compound in the forms described above may include 4CzIPN, 2CzPN, 4CzTPN-Ph, or PXZ-DPS, but embodiments are not limited thereto.

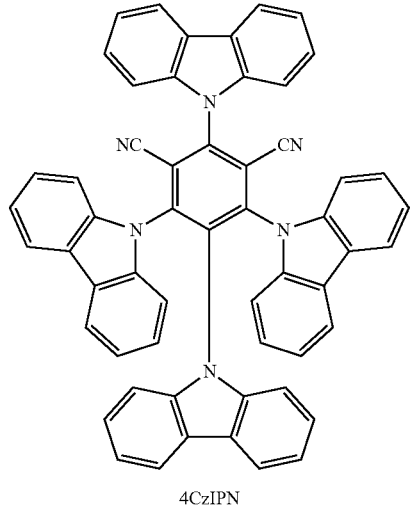

4CzIPN

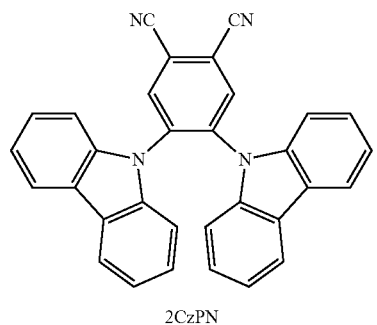

2CzPN

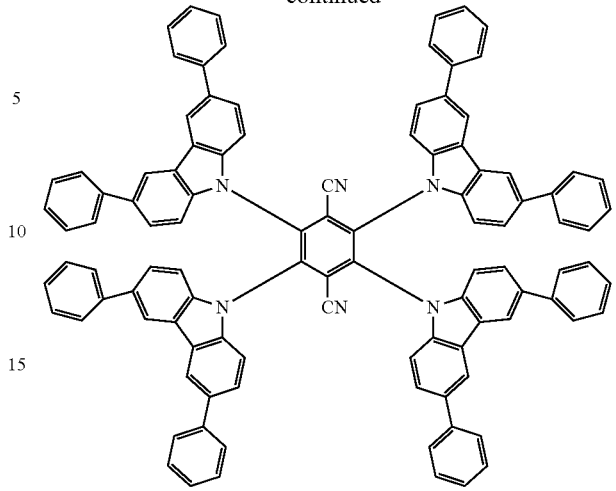

4CzTPN-Ph

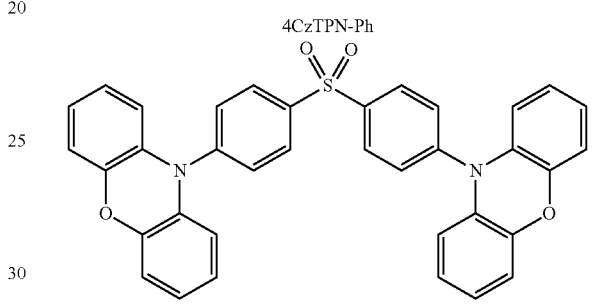

PXZ-DPS

In the emission layer 16, a dopant may include both a phosphorescent dopant and a fluorescent dopant.

The phosphorescent dopant may include a transition metal complex. The transition metal complex may include, for example, a complex including iridium (Ir), platinum (Pt), osmium (Os), gold (Au), titan (Ti), zirconium (Zr), hafnium (Hf), europium (Eu), terbium (Tb), or thulium (Tm). Examples of the phosphorescent dopant may include Ir(ppy)$_3$, Ir(ppy)$_2$(acac), Ir(mppy)$_3$, Ir(mpp)$_2$acac, F$_2$Irpic, (F$_2$ppy)$_2$Ir(tmd), Ir(ppy)$_2$tmd, Ir(pmi)$_3$, Ir(pmb)$_3$, FCNIr, FCNIrpic, FIr6, FIrN4, FIrpic, PtOEP, Ir(chpy)$_3$, P0-01 (C$_{31}$H$_{23}$IrN$_2$O$_2$S$_2$),Ir(ppz)$_3$, or Ir(dfppz)$_3$, but embodiments are not limited thereto.

Examples of the fluorescent dopant may include perylene, 2,5,8,11-tetra-tert-butylperylene (TBPe), 1,4-bis[2-(3-N-ethylcarbazoryl)vinyl]benzene (BCzVB), 4,4'-bis(9-ethyl-3-carbazovinylene)-1,1'-biphenyl (BCzVBi), (4,4'-bis[4-diphenylamino]styryl)biphenyl (BDAVBi), 4-(di-p-tolylamino)-4'-[(di-p-tolylamino)styryl]stilbene (DPAVB), 4,4'-bis[4-(di-p-tolylamino)styryl]bipnehyl (DPAVBi), 1-4-di-[4-(N,N-diphenyl)amino]styryl-benzene (DSA-Ph), Coumarin 6, C545T, N,N'-dimethyl-quinacridone (DMQA), 5,12-dibutylquinacridone (DBQA), 9,10-bis[N,N-di-(p-tolyl)-amino]anthracene (TTPA), 9,10-bis[phenyl(m-tolyl)-amino]anthracene (TPA), $N^{10},N^{10},N^{10'},N^{10'}$-tetra-tolyl-9,9'-bianthracene-10,10'-diamine (BA-TTB), $N^{10},N^{10},N^{10'},N^{10'}$-tetraphenyl-9,9'-bianthracene-10,10'-diamine (BA-TAB), $N^{10},N^{10'}$-diphenyl-$N^{10},N^{10'}$-dinaphthalenyl-9,9'-bianthracene-10,10'-diamine (BA-NPB), N,N'-diethylquinacridone (DEQ), 4-(dicyanomethylene)-2-methyl-6-[p-(dimethylamino)styryl]-4H-pyran (DCM), 4-(dicyanomethylene)-2-methyl-6-julolidyl-9-enyl-4H-pyran (DCM2), 4-(dicyanomethylene)-2-methyl-6-(1,1,7,7-tetramethyljulolidyl-9-enyl)-

4H-pyran (DCJT), 4-(dicyanomethylene)-2-tert-butyl-6-(1,1,7,7,-tetramethyljulolidyl-9-enyl)-4H-pyran (DCJTB), DCJTI, DCJMTB, 6,13-diphenylpentacene (DPP), 3-(dicyanomethylene)- 5,5 -dimethyl-1-[(4-dimethylamino) styryl] cyclohexene (DCDDC), 6-methyl-3-[3-(1,1,6,6-tetramethyl-10-oxo-2,3,5,6-tetrahydro-1H,4H,10H-11-oxa-3a-azabenzo[de]-anthracen-9-yl)acryloyfl]pyran-2,4-dione (AAAP), 3-(N-phenyl-N-p-tolylamino)-9-(N-p-styrylphenyl-N-p-tolylamino)perylene ((PPA)(PSA)Pe-1), 1,10-dicyano-substituted bis-styrylnaphthalene derivative (BSN) tetraphenyldibenzoperiflanthene (DBP), 2,8-di-tert-butyl-5,11-bis(4-tert-butylphenyl)-6,12-diphenyltetracene (TBRb), or rubrene, but embodiments are not limited thereto.

In the emission layer 16 of the organic light-emitting device 10, a weight ratio of the delayed fluorescent host: the phosphorescent dopant: the fluorescent dopant may be in a range of about 99.8:0.1:0.1 to about 70:15:15. When the weight ratio of the delayed fluorescent host: the phosphorescent dopant: the fluorescent dopant is within this range, satisfactory energy transition and emission may occur.

Figure 2:
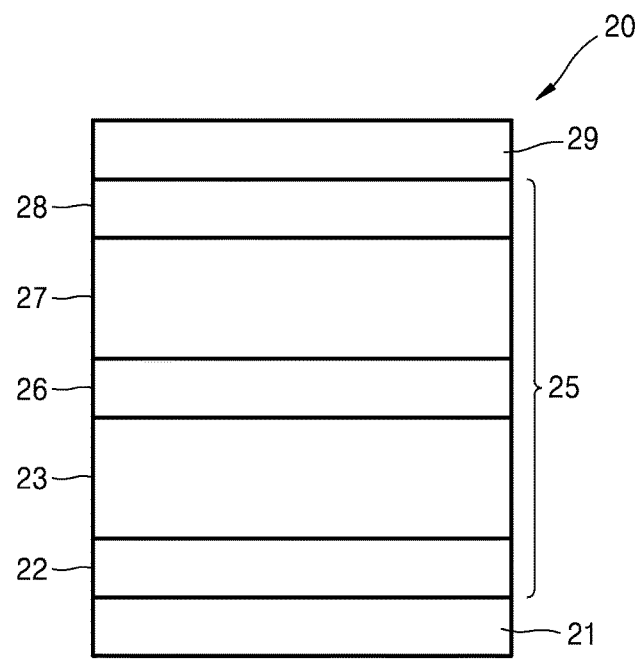
FIG. 2 is a cross-sectional view schematically illustrating an organic light-emitting device according to another embodiment.

FIG. 2 is a cross-sectional view schematically illustrating an organic light-emitting device 20 according to another embodiment.

The organic light-emitting device 20 includes a first electrode 21, a second electrode 29 facing the first electrode 21, and an organic layer 25 disposed between the first electrode 21 and the second electrode 29. The organic layer 25 includes an emission layer 26, a hole transport layer 23 disposed between the emission layer 26 and the first electrode 21, a hole injection layer disposed between the hole transport layer 23 and the first electrode 21, an electron transport layer 27 disposed between emission layer 26 and the second electrode 28, and an electron injection layer 28 disposed between the electron transport layer 27 and the second electrode 28. Here, at least one of a hole injection layer 22 and the electron injection layer 28 may be omitted. In addition, a buffer layer (not shown) may be further included between the emission layer 26 and the hole transport layer 23 or between the emission layer 26 and the electron transport layer 27.

The organic light-emitting device 20 may further include a substrate (not shown). The substrate (not shown) may be a substrate that is used in a general organic light-emitting device, or may be a glass substrate, a transparent plastic substrate, or a metal substrate, each having excellent mechanical strength, thermal stability, transparency, surface smoothness, ease of handling, and water-resistance.

The first electrode 21 may be a transparent electrode or a reflective electrode. In the case of a top emission-type organic light-emitting device, the first electrode 21 may be a transparent electrode. The transparent electrode may include ITO, IZO, ZnO, silver (Ag) nanowire, carbon nanotube, graphene, or a combination thereof. When the first electrode 21 is a reflective electrode, the reflective electrode may be prepared by forming a reflection layer formed of Ag, magnesium (Mg), aluminum (Al), Pt, palladium (Pd), gold (Au), nickel (Ni), neodymium (Nd), Ir, chromium (Cr), or a compound thereof, and then forming another layer formed of ITO, IZO, ZnO, or graphene on the reflection layer. The first electrode 21 may be formed by using various methods, for example, deposition, sputtering, or spin coating methods.

The hole injection layer 22 may be formed on the first electrode 21 by using various methods, such as vacuum deposition, spin coating, casting, or Langmuir-Blodgett (LB) deposition. A material used for the hole injection layer 22 may include an appropriate hole injection material, and examples thereof may include a phthalocyanine compound, such as copper phthalocyanine, m-MTDATA, TDATA, 4,4'-cyclohexylidenebis[N,N-bis(4-methylphenyl)benzenamine] (TAPC), 4,4 ',4"-tris[2-naphthyl(phenyl)amino]triphenylamine (2-TNATA), polyaniline/dodecylbenzenesulfonic acid (Pani/DBSA), poly(3,4-ethylenedioxythiophene)/poly (4-styrenesulfonate) (PEDOT/PSS), polyaniline/camphorsulfonic acid (Pani/CSA), or polyaniline/poly(4-styrenesulfonate) (Pani/PSS), but embodiments are not limited thereto.

The hole transport layer 23 may include the hole transporting host of the emission layer 26. Alternatively, the hole transport layer 23 may include an appropriate hole transporting host, such as TPD, NPB, a-NPD, or TCTA. The hole transport layer 23 may be formed by using various methods, such as vacuum deposition, spin coating, casting, or LB deposition.

The emission layer 26 of the organic light-emitting device 20 has the same structure as that of the emission layer 16 of the organic light-emitting device 10. That is, the emission layer 26 may include the delayed fluorescent host, the phosphorescent dopant, and the fluorescent dopant. The delayed fluorescent host may include a combination of the hole transporting host and the electron transporting host which form an exciplex, or a single delayed fluorescent organic compound. The emission layer 26 of the organic light-emitting device 20 may be understood by referring to the description of the emission layer 16 of the organic light-emitting device 10. The emission layer 26 may be formed by using various methods, such as vacuum deposition, spin coating, casting, or LB deposition.

The electron transport layer 27 may include the electron transporting host of the emission layer 26. Alternatively, the electron transport layer 27 may include an appropriate electron transporting host, such as Alq$_3$, bathocuproine (BCP), 4,7-diphenyl-1,10-phenanthroline (Bphen), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-Biphenyl-4-olato)aluminum (Balq), bis(10-hydroxybenzo[h]quinolinato)beryllium) (Bebq$_2$), or 9,10-di (naphth-2-yl)anthracene (ADN). The electron transport layer 27 may be formed by using various methods, such as vacuum deposition, spin coating, casting, or LB deposition.

The electron injection layer 28 may be formed by using a material, such as LiF, NaCl, CsF, Li$_2$O, or BaO. The electron injection layer 28 may he formed by using various methods, such as vacuum deposition, spin coating, casting, or LB deposition.

The second electrode 29 may have a structure including an alkali metal such as lithium, sodium, potassium, rubidium, or cesium; an alkali earth metal such as beryllium, magnesium, calcium, strontium, or barium; a metal such as aluminum, scandium, vanadium, zinc, yttrium, indium, cerium, samarium, europium, terbium, or ytterbium; an alloy of at least two selected therefrom; an alloy of at least one selected therefrom and at least one selected from gold, silver, platinum, copper, manganese, titanium, cobalt, nickel, tungsten, and tin; or at least two selected therefrom. In the case of a top emission-type organic light-emitting device, the second electrode 29 may be formed of a transparent oxide, such as ITO, IZO, ZnO, or graphene. The second electrode 29 may be formed by using known various methods, such as deposition, sputtering, or spin coating.

MODE OF THE INVENTION

Hereinafter, one or more embodiments will be described in detail with reference to the following non-limiting Experimental Example and Examples. However, these examples are not intended to limit the scope of the one or more embodiments.

Experimental Example

Figure 3:
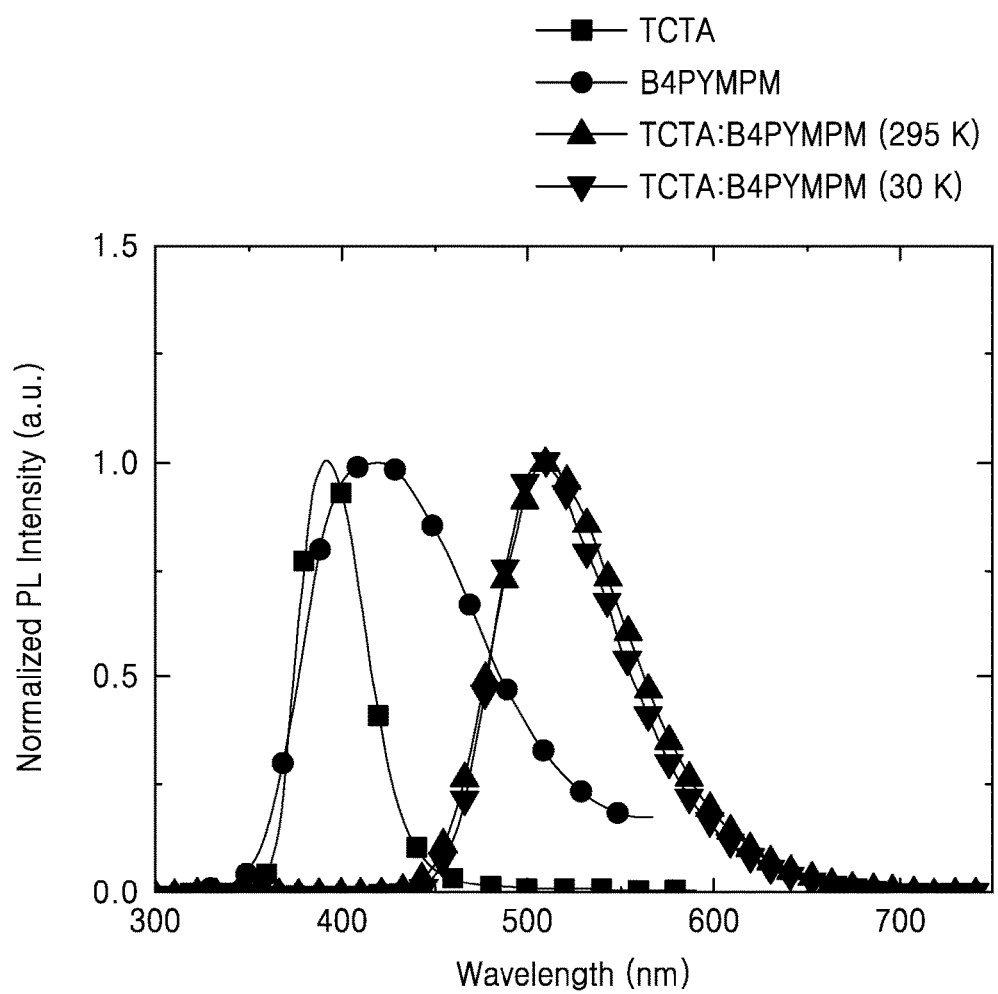
FIG. 3 shows photoluminescence spectra of a TCTA thin film, a B4PYMPM thin film, and a TCTA:B4PYMPM thin film.

FIG. 3 shows photoluminescence spectra of a TCTA thin film, a B4PYMPM thin film, and a TCTA:B4PYMPM thin film. The TCTA:B4PYMPM thin film is a thin film in which TCTA and B4PYMPM were mixed at a ratio (molar ratio) of 1:1. The photoluminescence spectra of the TCTA thin film and the B4PYMPM thin film were each measured at temperature of about 295 K, and the photoluminescence spectrum of the TCTA:B4PYMPM film were measured at two different temperatures of about 295 K and 30 K. The thin films were excited using light at a wavelength of about 355 nm from a Nd:YAG laser (Continuum), and then wavelength-dependent photoluminescence of the thin films was detected by an intensified charge-coupled device (iCCD), thereby measuring photoluminescence spectra of the thin films. Referring to FIG. 3, the photoluminescence spectrum of the TCTA:B4PYMPM thin film appeared in the longer wavelength range, compared to the spectra of the TCTA thin film and the B4PYMPM film. That is, in the TCTA:B4PYMPM thin film, TCTA and B4PYMPM formed an exciplex.

Figure 4:
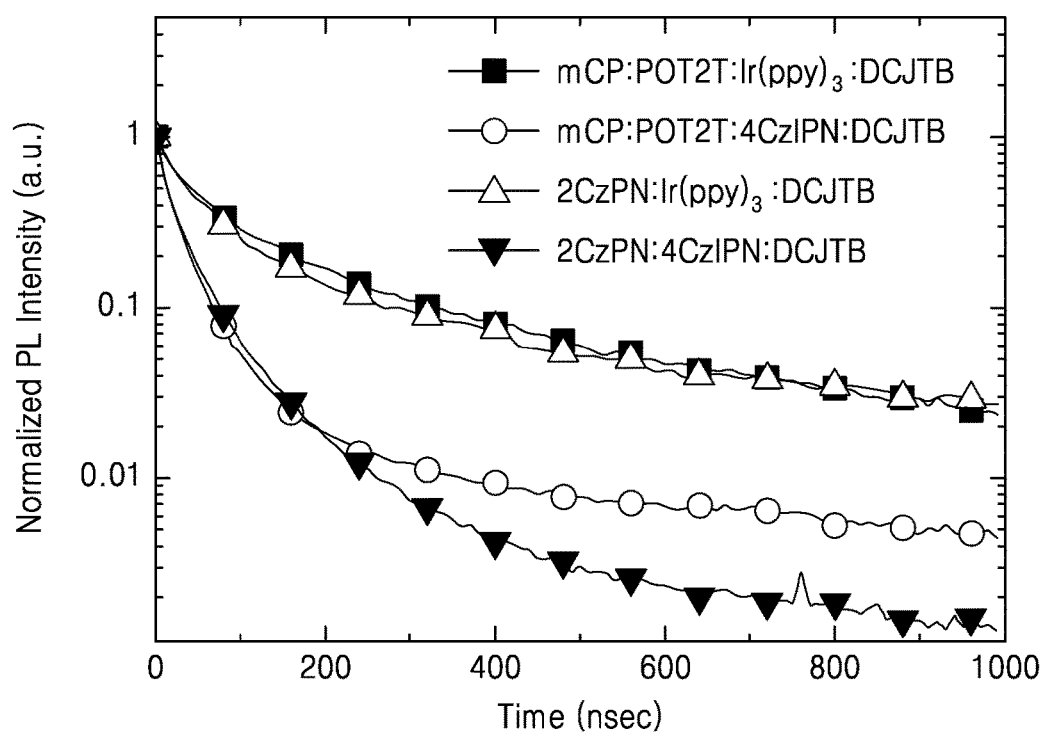
FIG. 4 shows transient photoluminescence characteristics of a mCP:PO-T2T:Ir(ppy)$_3$:DCJTB thin film, a mCP:PO-T2T:4CzIPN:DCJTB thin film, a 2CzPN:Ir(ppy)$_3$:DCJTB thin film, and a 2CzPN:4CzIPN:DCJTB thin film.

FIG. 4 shows transient photoluminescence characteristics of an mCP:PO-T2T:Ir(ppy)$_3$:DCJTB thin film, in which an mCP:PO-T2T exciplex host was doped with Ir(ppy)$_3$ and DCJTB, an mCP:PO-T2T:4CzIPN:DCJTB thin film, in which an mCP:PO-T2T exciplex host was doped with 4CzIPN and DCJTB, a 2CzPN:Ir(ppy)$_3$:DCJTB thin film, in which a 2CzPN delayed fluorescent organic compound was doped with Ir(ppy)$_3$ and DCJTB, and a 2CzPN:4CzIPN:DCJTB thin film, in which a 2CzPN delayed fluorescent organic compound was doped with 4CzIPN and DCJTB. The mCP:PO-T2T:Ir(ppy)$_3$:DCJTB thin film, the mCP:PO-T2T:4CzIPN:DCJTB thin film, the 2CzPN:Ir(ppy)$_3$:DCJTB thin film, and the 2CzPN:4CzIPN:DCJTB thin film were prepared by mixing the corresponding elements of the thin films at a ratio (weight ratio) of about 91.5:8:0.5, about 94.5:5:0.5, about 91.5:8:0.5, and about 94.5:5:0.5, respectively, wherein mCP and PO-T2T were mixed at a ratio (molar ratio) of about 1:1. The thin films were excited using light at a wavelength of about 355 nm from a Nd:YAG laser (Continuum), and then photoluminescence of the thin films was detected by an iCCD from 0 second to 1 microsecond, thereby measuring photoluminescence intensity of the thin films according to the time. Referring to FIG. 4, it was confirmed that, when Ir(ppy)$_3$, a phosphorescent dopant, was doped in the mCP:PO-T2T exciplex host or the delayed fluorescent organic compound 2CzPN, the delayed fluorescence of DCJTB fluorescent dopant was increased, compared to when 4CzIPN, a delayed fluorescent material, was doped. That is, it was confirmed that the doping the phosphorescent dopant in the delayed fluorescent host can increase the amount of singlet excited states for the fluorescent dopant.

Figure 5:
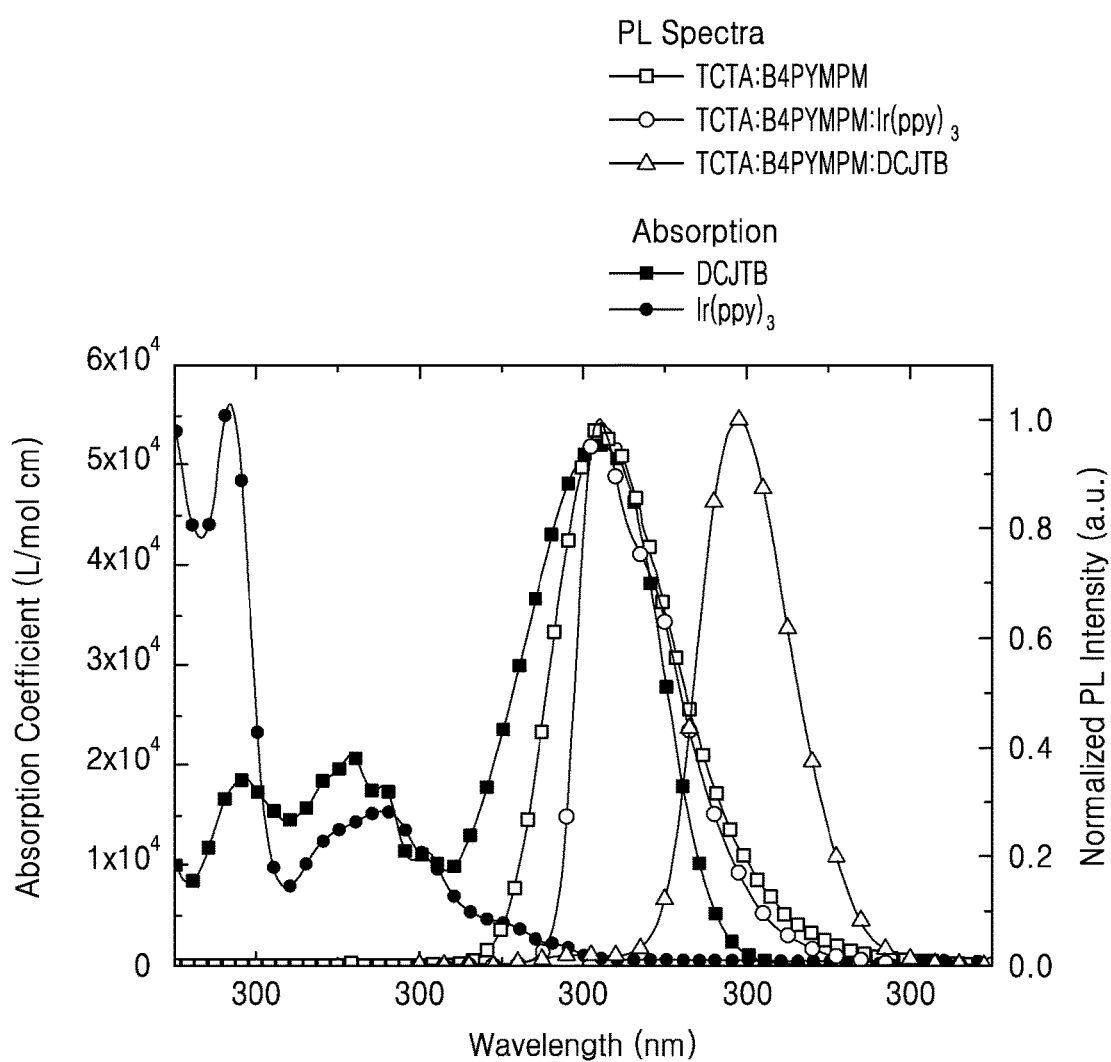
FIG. 5 shows photoluminescence spectra of a TCTA:B4PYMPM thin film, a TCTA:B4PYMPM:Ir(ppy)$_3$ thin film, and a TCTA:B4PYMPM:DCJTB thin film and absorption spectra of a DCJTB solution and an Ir(ppy)$_3$ solution.
Figure 6A:
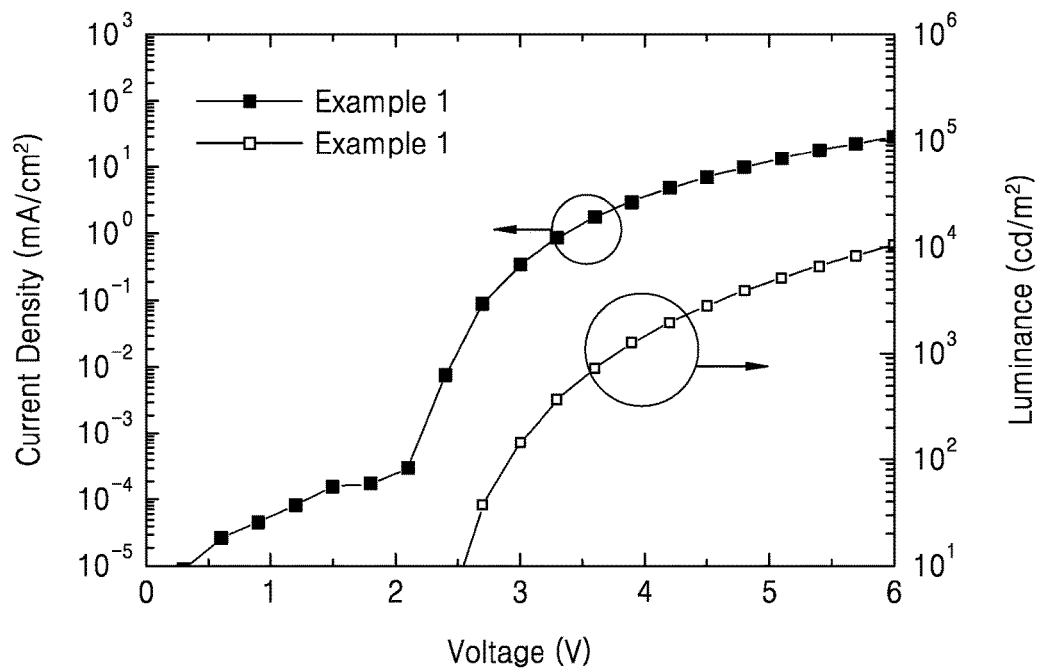
FIGS. 6A to 6D each show a graph of a current density versus a voltage and a graph of a luminance versus a voltage of organic light-emitting devices prepared in Examples 1 to 3 and Comparative Example 1.
Figure 6B:
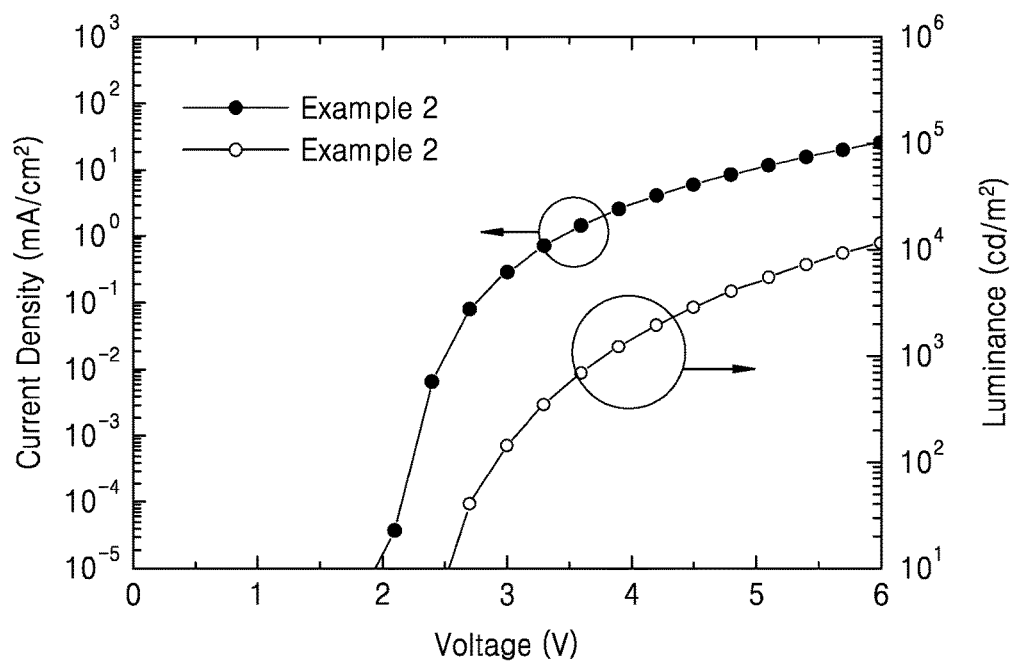
Figure 6C:
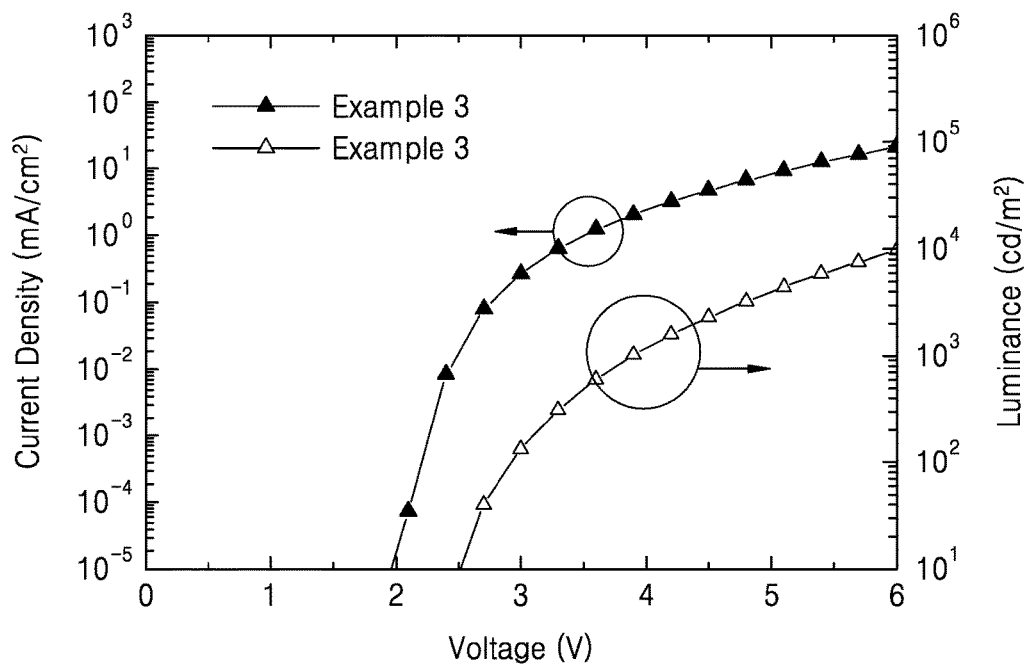
Figure 6D:
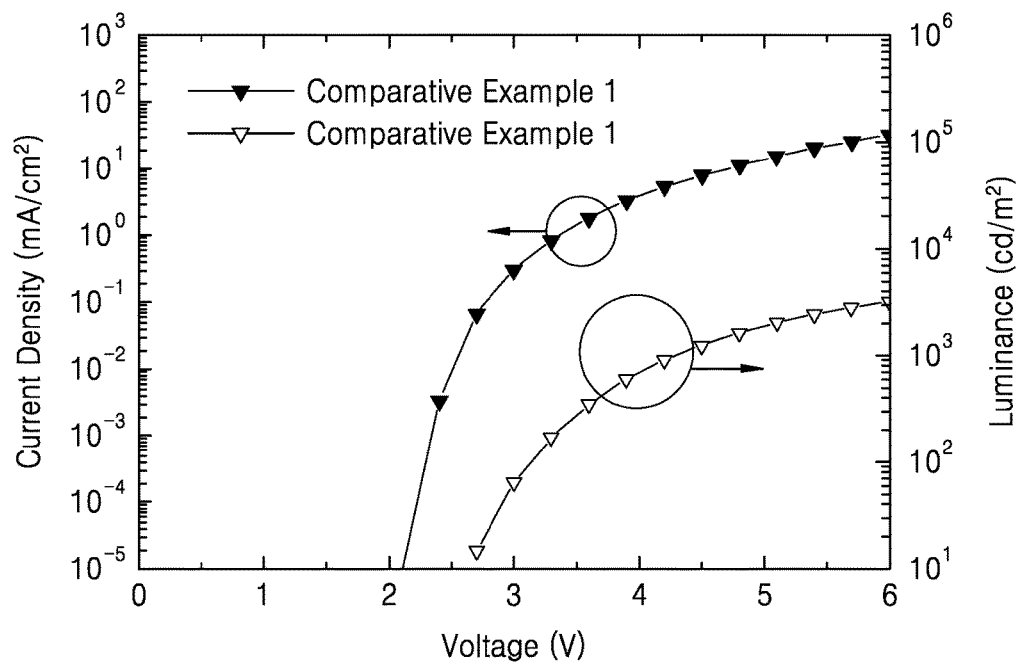
Figure 7A:
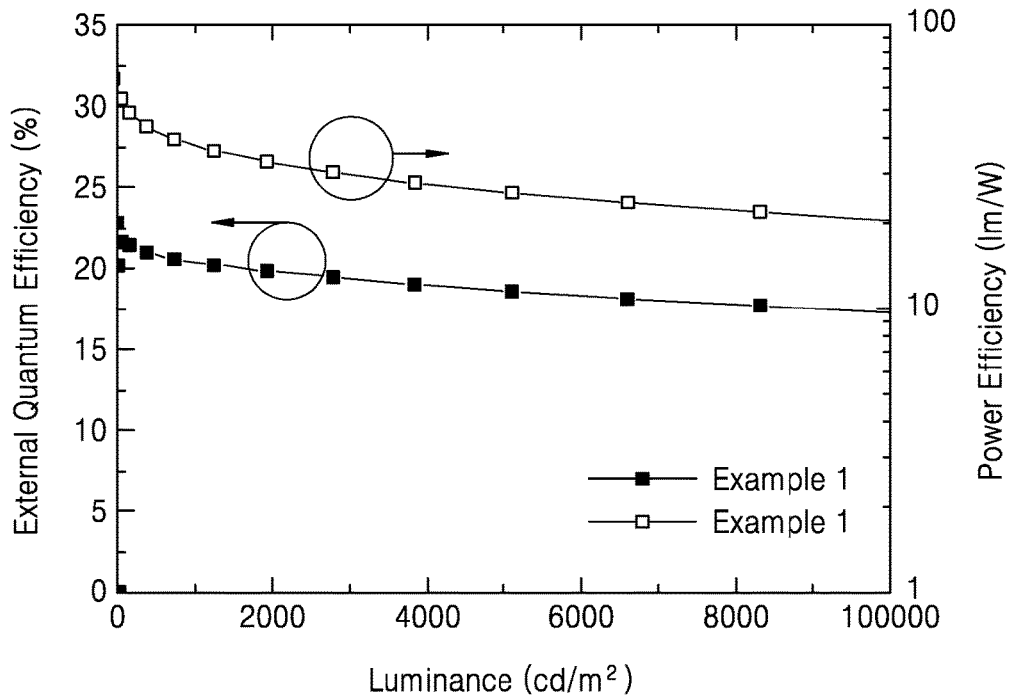
FIGS. 7A to 7D each show a graph of an external quantum efficiency versus a luminance and a graph of a power efficiency versus a luminance of organic light-emitting devices prepared in Examples 1 to 3 and Comparative Example 1.
Figure 7B:
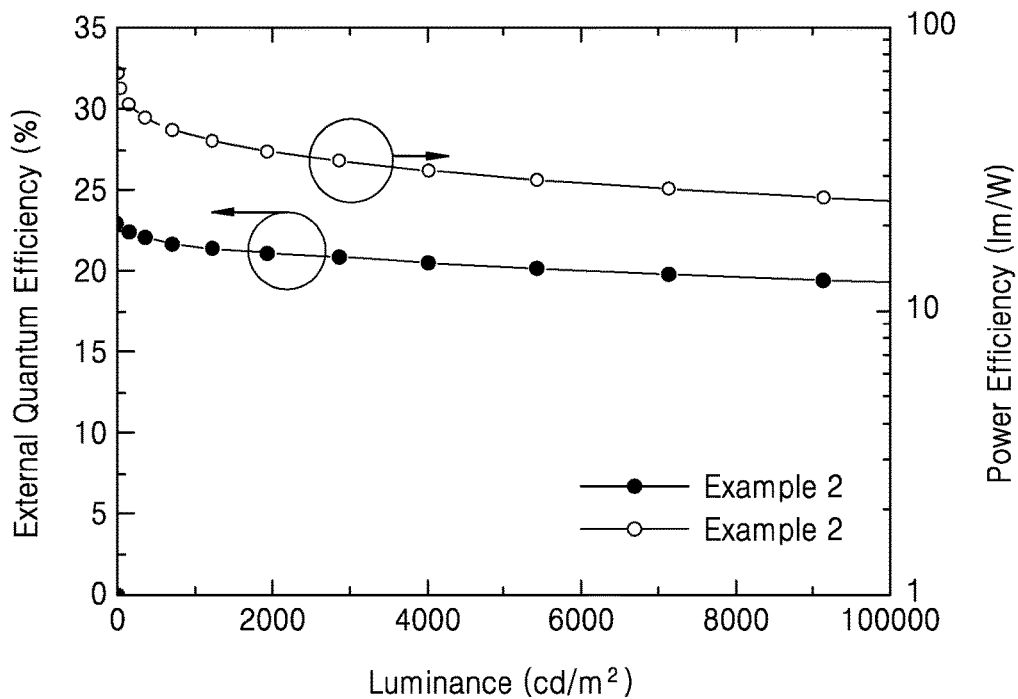
Figure 7C:
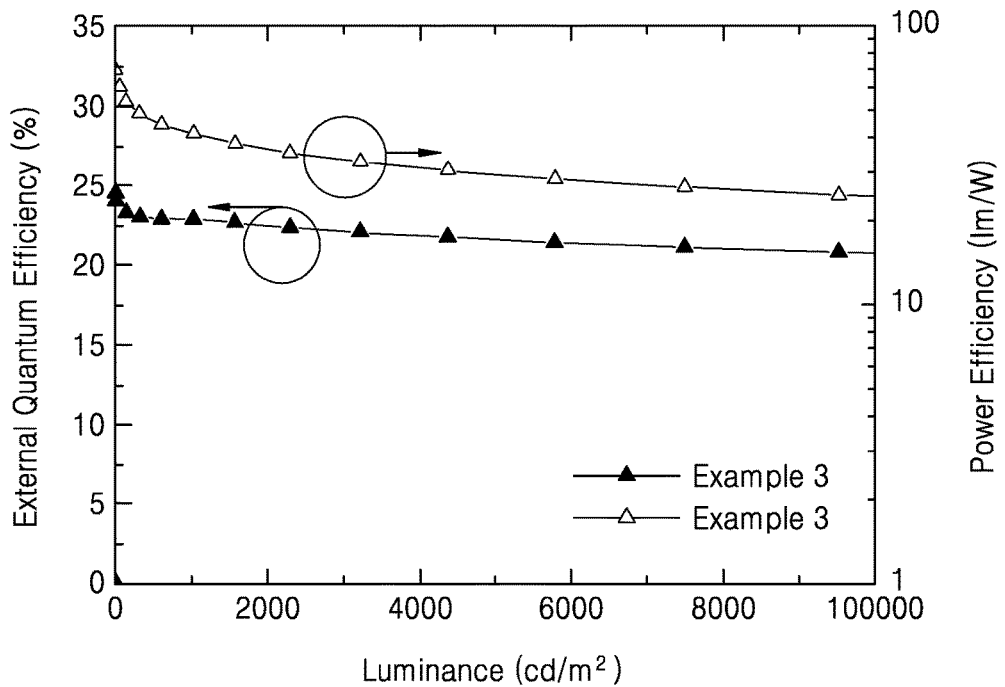
Figure 7D:
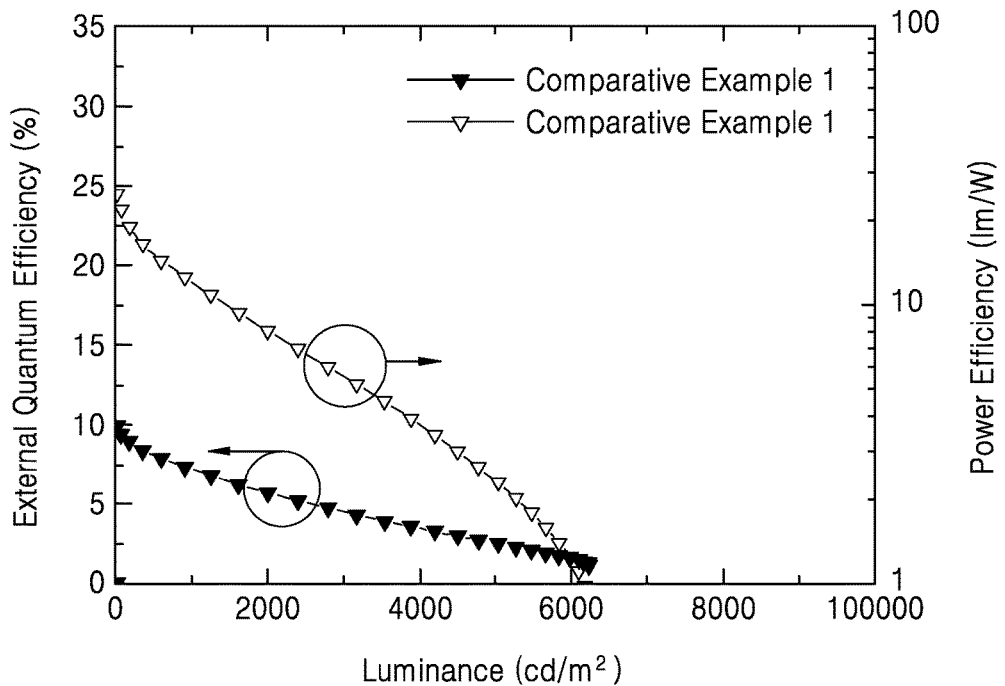

FIG. 5 shows photoluminescence spectra of a TCTA:B4PYMPM thin film, an TCTA:B4PYMPM:Ir(ppy)$_3$ thin film, and a TCTA:B4PYMPM:DCJTB thin film and absorption spectra of a DCJTB solution and an Ir(ppy)$_3$ solution.

The absorption spectra of DCJTB and Ir(ppy)$_3$ in a solution state were each measured using a Cary 5000 UV-VIS-NIR spectrometer. Here, chloroform was used as a solvent, and the amount of a solute was about 10$^{-5}$M. Referring to FIG. 5, an overlapping area between the absorption spectrum of the DCJTB thin film and the photoluminescence spectra of the TCTA:B4PYMPM thin film and the Ir(ppy)$_3$ thin film is significantly large. That is, it was confirmed that the energy transfer to the DCJTB fluorescent dopant from the TCTA:B4PYMPM host and the Ir(ppy)$_3$ phosphorescent dopant occurred efficiently.

Table 1 shows triplet energy levels or singlet energy levels of TCTA, B4PYMPM, TCTA:B4PYMPM exciplex, Ir(ppy)$_3$, and DCJTB.

TABLE 1

| TCTA | B4PYMPM | TCTA:B4PYMPM exciplex | Ir(ppy)$_3$ | DCJTB |
|---|---|---|---|---|
| 2.8 eV (triplet energy) | 2.75 eV (triplet energy) | 2.45 eV (singlet energy and triplet energy) | 2.4 eV (triplet energy) | 1.75 eV (singlet energy) |

Referring to Table 1, since the singlet energy level (S1$_{EX}$) of the TCTA:B4PYMPM exciplex is almost the same as the triplet energy level of the TCTA:B4PYMPM exciplex, RISC may occur in a rapid manner. In addition, Ir(ppy)$_3$ may stimulate and increase RISC of the exciplex. Also, due the large extent of the overlap between the photoluminescence spectrum of the exciplex and the absorption spectrum of the DCJTB, the singlet excited state (S1$_{EX}$) energy of the exciplex may be easily transferred to the singlet excited state (S1$_F$) energy of the DCJTB. In addition, since the triplet excited state (T1$_P$) energy of the Ir(ppy)$_3$ is higher than the singlet excited state (S1$_F$) energy and triplet excited state (T1$_F$) energy of the DCJTB, the singlets of the DCJTB may emit fluorescence, rather than being transferred to the Ir(ppy)$_3$.

EXAMPLES

Current densities, luminances, electroluminescence spectra (EL spectra) were measured using a programmable source meter (Keithley 2400) and a spectrophotometer (SpectraScan PR650). Also, angular distribution of the EL was measured using a programmable source meter (Keithley 2400) and a fiber optic spectrometer (Ocean Optics S2000). External quantum efficiencies and electric power efficiencies of the organic light-emitting devices were calculated from current density to voltage to obtain luminance characteristic and each distribution of the EL spectrum and the EL intensity.

Example 1

1,000 Å-thick-patterned ITO which is on a glass substrate, was used as an anode. The ITO glass substrate was pre-washed with isopropyl alcohol and acetone, and then was exposed to UV-ozone for 10 minutes. Next, TAPC was deposited on the ITO glass substrate to form a hole injection layer having a thickness of 650 Å. TCTA was deposited on the hole injection layer to form a hole transport layer having a thickness of 100 Å. Then, (TCTA:B4PYMPM):Ir(ppy)$_3$:DCJTB, wherein a molar ratio of TCTA to B4PYMPM was maintained to 1:1, was co-deposited on the hole transport layer at a weight ratio of 97.5:2:0.5 to form an emission layer having a thickness of 300 Å. Then, B4PYMPM was deposited on the emission layer to form an electron transport layer having a thickness of 550 Å. Next, LiF was deposited on the electron transport layer to form an electron injection layer having a thickness of 7 Å, and then Al was deposited thereon to form a cathode having a thickness of 1,000 Å. Here, each of the layers was thermally deposited in vacuum maintained at $5 \times 10^{-7}$ torr.

Example 2

An organic light-emitting device of Example 2 was prepared in the same manner as in Example 1, except that in forming the emission layer, (TCTA:B4PYMPM):Ir(ppy)$_3$: DCJTB were co-deposited at a weight ratio of 95.5:4:0.5 instead of a weight ratio of 97.5:2:0.5.

Example 3

An organic light-emitting device of Example 3 was prepared in the same manner as in Example 1, except that in forming the emission layer, (TCTA:B4PYMPM):Ir(ppy)$_3$: DCJTB were co-deposited at a weight ratio of 91.5:8:0.5 instead of a weight ratio of 97.5:2:0.5.

Comparative Example 1

An organic light-emitting device of Comparative Example 1 was prepared in the same manner as in Example 1, except that in forming the emission layer, (TCTA: B4PYMPM):DCJTB were co-deposited at a weight ratio of 99.5:0.5 instead of co-depositing (TCTA:B4PYMPM):Ir (ppy)$_3$:DCJTB at a weight ratio of 97.5:2:0.5.

The structures of the organic light-emitting devices prepared in Examples 1 to 3 and Comparative Example 1 are shown in Table 2.

TABLE 2

| | Structure |
|---|---|
| Example 1 | ITO (100 nm)/TAPC (65 nm)/TCTA (10 nm)/ TCTA:B4PYMPM:2 wt % Ir(ppy)$_3$:0.5 wt % DCJTB (30 nm)/B4PYMPM (55 nm)/LiF (0.7 nm)/Al (100 nm) |
| Example 2 | ITO (100 nm)/TAPC (65 nm)/TCTA (10 nm)/ TCTA:B4PYMPM:4 wt % Ir(ppy)$_3$:0.5 wt % DCJTB (30 nm)/B4PYMPM (55 nm)/LiF (0.7 nm)/Al (100 nm) |
| Example 3 | ITO (100 nm)/TAPC (65 nm)/TCTA (10 nm)/ TCTA:B4PYMPM:8 wt % Ir(ppy)$_3$:0.5 wt % DCJTB (30 nm)/B4PYMPM (55 nm)/LiF (0.7 nm)/Al (100 nm) |
| Comparative Example 1 | ITO (100 nm)/TAPC (65 nm)/TCTA (10 nm)/ TCTA:B4PYMPM:0.5 wt % DCJTB (30 nm)/B4PYMPM (55 nm)/LiF (0.7 nm)/Al (100 nm) |

FIGS. 6A to 6D each show a graph of a current density versus a voltage and a graph of a luminance versus a voltage of organic light-emitting devices prepared in Examples 1 to 3 and Comparative Example 1. Referring to FIGS. 6A to 6D, it was confirmed that the organic light-emitting devices prepared in Examples 1 to 3 showed a voltage-dependent current density and a voltage-dependent luminance in a similar manner, and also showed a similar turn-on voltage of about 2.4 V. However, the organic light-emitting device prepared in Comparative Example 1 showed a turn-on voltage of about 2.7 V, which is higher than that of the organic light-emitting devices prepared in Examples 1 to 3, and showed a lower luminance than that of the organic light-emitting devices prepared in Examples 1 to 3. FIGS. 7A to 7D each show a graph of an external quantum efficiency and a power efficiency of the organic light-emitting devices prepared in Examples 1 to 3 and Comparative Example 1. Referring to FIGS. 7A to 7D, the organic light-emitting device prepared in Example 3 showed the highest external quantum efficiency of about 24.5%. In addition, the organic light-emitting devices prepared in Examples 1 to 3 each showed an external quantum efficiency of at least 17% with low roll-off at a luminance of 10,000 cd/m$^2$. Therefore, it was confirmed that the organic light-emitting devices prepared in Examples 1 to 3 exhibited significantly high quantum efficiencies with low roll-off. However the organic light-emitting device prepared in Comparative Example 1 shows an external quantum efficiency of 9.9%, which exhibits significantly low external quantum efficiency and power efficiency compared to those of the organic light-emitting devices prepared in Examples 1 to 3.

TABLE 3

| | Voltage | | External quantum efficiency | | Power efficiency | |
|---|---|---|---|---|---|---|
| | Turn-on | @ 1000 cd/m$^2$ | Maximum | @ 1000 cd/m$^2$ | Maximum | @ 1000 cd/m$^2$ |
| Example 1 | 2.4 V | 3.8 V | 21.6% | 20.2% | 56.8 lm/W | 35.9 lm/W |
| Example 2 | 2.4 V | 3.8 V | 23.5% | 21.4% | 68.5 lm/W | 39.6 lm/W |
| Example 3 | 2.4 V | 3.9 V | 24.5% | 22.8% | 69.2 lm/W | 41.0 lm/W |
| Comparative Example 1 | 2.4 V | 4.3 V | 9.9% | 7.3% | 24.9 lm/W | 12.5 lm/W |

The invention claimed is:

1. An organic light-emitting device comprising:
a first electrode;
a second electrode facing the first electrode; and
an emission layer disposed between the first electrode and the second electrode and comprising a delayed fluorescent host and a dopant,
wherein the delayed fluorescent host comprises:
an exciplex host which is a combination of a hole transporting host and an electron transporting host that combine together to form an exciplex; or
a delayed fluorescent organic compound in the form of D-C-A (an electron donation group: D—a connecting group: C—an electron accepting group: A), in the form of D-C-A-C-D, or in the form of A-C-D-C-A, and
the dopant comprises both a phosphorescent dopant and a fluorescent dopant
wherein a triplet excited state energy level of the phosphorescent dopant is higher than a singlet excited state energy level and a triplet excited state energy level of the fluorescent dopant, and
wherein a photoluminescence spectrum of the delayed fluorescent host overlaps an absorption spectrum of the fluorescent dopant, and a photoluminescence spectrum of the phosphorescent dopant overlaps an absorption spectrum of the fluorescent dopant.

2. The organic light-emitting device of claim 1, wherein a difference between a singlet exciplex energy level and a triplet exciplex energy level of the exciplex host is about 0 eV or more to less than about 0.3 eV.

3. The organic light-emitting device of claim 1, wherein the singlet exciplex energy level and the triplet exciplex energy level of the exciplex host are higher than a singlet excited energy level of the fluorescent dopant.

4. The organic light-emitting device of claim 1, wherein a lower unoccupied molecular orbital (LUMO) of the hole transporting host is higher than that of the electron transporting host by about 0.2 eV or more, but not as high as a band gap of the hole transporting host, and a highest occupied molecular orbital (HOMO) of the hole transporting host is higher than that of the electron transporting host by about 0.2 eV or more, but not as high as a band gap of the hole transporting host.

5. The organic light-emitting device of claim 1, wherein, when the delayed fluorescent host comprises the exciplex host, a weight ratio of the hole transporting host to the electron transporting host is in a range of about 20:80 to about 80:20.

6. The organic light-emitting device of claim 1, wherein, when the delayed fluorescent host comprises the delayed fluorescent organic compound, a difference between a singlet excited state energy level and a triplet excited state energy level of the delayed fluorescent organic compound is about 0 eV or more to less than about 0.3 eV.

7. The organic light-emitting device of claim 1, wherein, when the delayed fluorescent host comprises the delayed fluorescent organic compound, a singlet excited state energy level and a triplet excited state energy level of the delayed fluorescent organic compound are higher than a singlet excited state energy level of the fluorescent dopant.

8. The organic light-emitting device of claim 1, wherein a singlet excited state energy of the exciplex or a singlet excited state energy of the delayed fluorescent organic compound is transferred to the fluorescent dopant.

9. The organic light-emitting device of claim 1, wherein the hole transporting host comprises a carbazole derivative or an aromatic amine compound.

10. The organic light-emitting device of claim 1, wherein the electron transporting host comprises a π-electron deficient heteroaromatic ring.

11. The organic light-emitting device of claim 1, wherein the electron transporting host comprises a phosphine oxide group-containing compound, a sulfur oxide group-containing group, or a triazine derivative.

12. The organic light-emitting device of claim 1, wherein the phosphorescent dopant comprises a transition metal complex.

13. The organic light-emitting device of claim 1, wherein the phosphorescent dopant comprises a complex comprising iridium (Ir), platinum (Pt), osmium (Os), gold (Au), titanium (Ti), zirconium (Zr), hafnium (Hf), europium (Eu), terbium (Tb), or thulium (Tm).

14. The organic light-emitting device of claim 1, wherein a weight ratio of the delayed fluorescent host:phosphorescent dopant:fluorescent dopant is in a range of about 99.8: 0.1:0.1 to about 70:15:15.

15. The organic light-emitting device of claim 1, further comprising a hole transporting region between the emission layer and the first electrode.

16. The organic light-emitting device of claim 1, further comprising an electron transporting region between the emission layer and the second electrode.

* * * * *